United States Patent [19]

Takahashi

[11] 4,156,202
[45] May 22, 1979

[54] IMPULSIVE NOISE REDUCING SYSTEM

[75] Inventor: Nobuaki Takahashi, Yamato, Japan

[73] Assignee: Victor Company of Japan, Ltd., Yokohama, Japan

[21] Appl. No.: 809,526

[22] Filed: Jun. 24, 1977

[30] Foreign Application Priority Data

Jun. 28, 1976 [JP] Japan .................................. 51-76219
Jun. 28, 1976 [JP] Japan .................................. 51-76220

[51] Int. Cl.² ........................................... H04B 1/10
[52] U.S. Cl. .................................. 328/163; 328/165; 328/147; 307/358; 325/474
[58] Field of Search ................. 328/163, 165, 167, 147, 328/162; 307/236, 358; 325/474

[56] References Cited

U.S. PATENT DOCUMENTS

| 3,348,065 | 10/1967 | Schmidt | 307/358 X |
| 3,588,705 | 6/1971 | Paine | 328/165 X |
| 3,638,183 | 1/1972 | Progler et al. | 307/358 X |
| 3,947,699 | 3/1976 | Whitmer | 328/147 X |
| 3,968,383 | 7/1976 | Smith | 328/165 X |
| 3,979,683 | 9/1976 | Ikeda | 328/165 |

Primary Examiner—John S. Heyman

[57] ABSTRACT

An impulsive noise reducing system comprises a peak level detector for producing a detection signal with specific rise and fall time constants, in response to positive and/or negative peak levels of an input signal. Any signal which relatively exceeds the level of the detection signal by positive and/or negative peak levels of impulsive noise admixed in the input signal causes a control signal to be generated. Responsive to the control signal, that part of the input signal wherein the impulsive noise exists is suppressed.

8 Claims, 8 Drawing Figures

FIG.1

FIG.2

IMPULSIVE NOISE REDUCING SYSTEM

BACKGROUND OF THE INVENTION

The present invention relates generally to systems for reducing impulsive noise, and more particularly to a system for effectively reducing impulsive noise in transmitted audio signals, such as music.

In general, if there are damaged parts or if extraneous substances such as dust exist on the surface of the record disc, an impulsive noise commonly called a "popping noise" becomes admixed with the reproduced audio signal.

In a conventional record disc reproducing apparatus, however, there is no circuit for reducing this impulsive noise. When a record disc with a damaged sound groove or a record disc with dust adhering thereto is reproduced (played), the impulsive noise is reproduced at the same time to produce an unpleasant to the sensation listener.

However, when this impulsive noise was examined, it was found that, its frequency differs depending upon the nature of the damage to the sound groove and the dust on the record disc. The incidence noise frequency ranges from a low value in the order of one occurrence in the period (1.8 seconds) of one revolution of the record disc to a high value of the order of several occurrences per second, in the case of a record disc having damage within the limit of hearing. In addition, the level of the peak of an impulsive noise is considerably higher than the average level of an ordinary music signal.

In contrast, in general music, the ratio of the peak signal level relative to the average signal level is not high. However, a trumpet sound is an example of a signal wherein this ratio is relatively high. In the signal of this trumpet sound, while the ratio of the peak level relative to the average level is high, the number of cycles of repetition of the peak is of the order of 500 to 1,000 in one second. This is extremely great in comparison with the above mentioned frequency of the impulsive noise.

SUMMARY OF THE INVENTION

Accordingly, on a basis of the above described findings, we have developed a system by which the impulsive noise admixed in a music signal is distinguished from the music signal and thus positively and accurately detected, and this noise is reduced.

It is a general object of the present invention to provide a system for reducing impulsive noises admixed in a signal reproduced from a record disc.

Another object of the invention is to provide a system by which impulsive noise admixed in a signal reproduced from a record disc is positively distinguished and detected from the reproduced music signal. The noise is reduced in response and according to the resulting detection output.

Still another object of the invention is to provide a system by which impulsive noise admixed in a signal reproduced from a record disc is positively detected and reduced relative to the reproduced music signal, irrespective of the level of the reproduced music signal and regardless of the existence of a music signal of high peak level relative to the average level.

Other objects and further features of the invention will become apparent from the following detailed description with respect to preferred embodiments of the invention when read in conjunction with the accompanying drawings.

DETAILED DESCRIPTION

Figure 1:
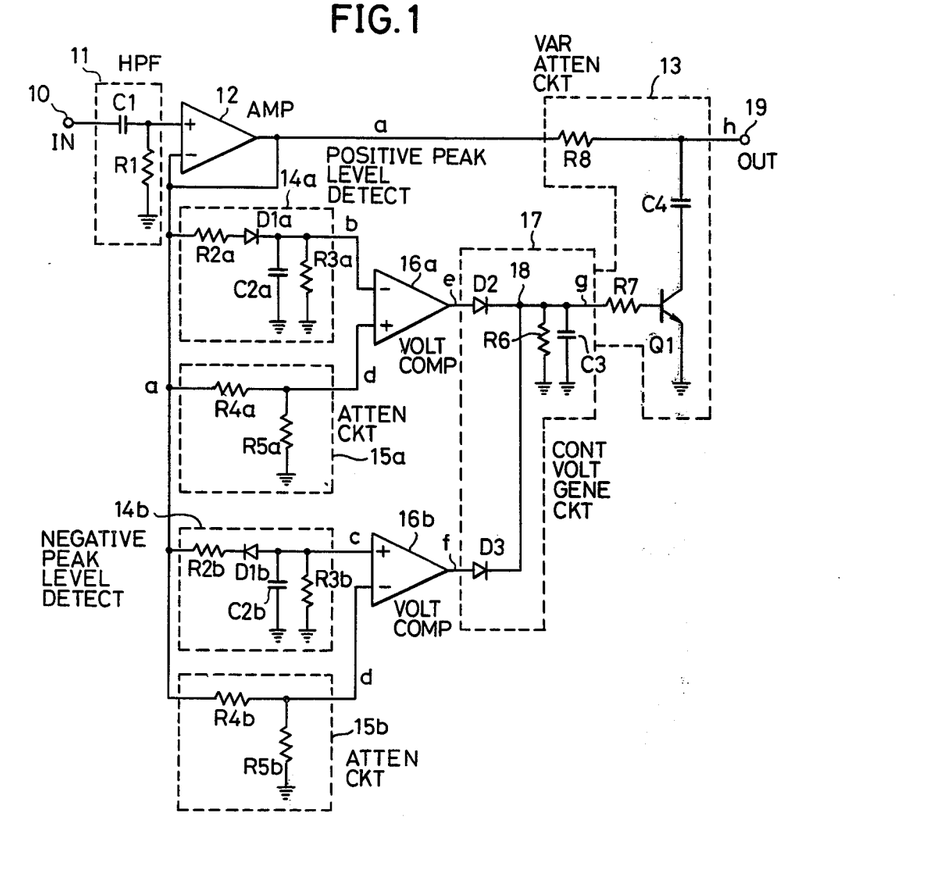
FIG. 1 is an electrical circuit diagram showing a first embodiment of an impulsive noise reducing system of the present invention.

Referring to FIG. 1, illustrating a first embodiment of the invention, an audio signal reproduced from a record disc (not shown) is introduced into the system through an input terminal 10. It passes through a high-pass filter 11 comprising a capacitor C1 and a resistor R1, and is supplied to a non-inverting amplifier 12. There it is impedance converted and amplified. The output signal of the amplifier 12 is supplied to a variable attenuation circuit 13. At the same time, it is supplied respectively to a positive peak level detection circuit 14a, an attenuation circuit 15a, a negative peak level detection circuit 14b, and an attenuation circuit 15b.

The positive peak level detection circuit 14a comprises resistors R2a and R3a, a forwardly connected diode D1a, and a capacitor C2a. Similarly, the negative peak level detection circuit 14b comprises resistors R2b and R3b, a reversely connected diode D1b, and a capacitor C2b. In the positive peak level detection circuit 14a, the charging time constant of the resistor R2a and the capacitor C2a and the discharging time constant of the capacitor C2a and the resistor R3a are respectively selected so that the rise time will be of the order of 200μsec. to 2m sec., and the fail time will be of the order of 100m sec. to 1 second. The same applies also to the negative peak level detection circuit 14b. In this connection, all of the peak level detection circuits in the present specification have rise time constants, as described above.

Figure 2:
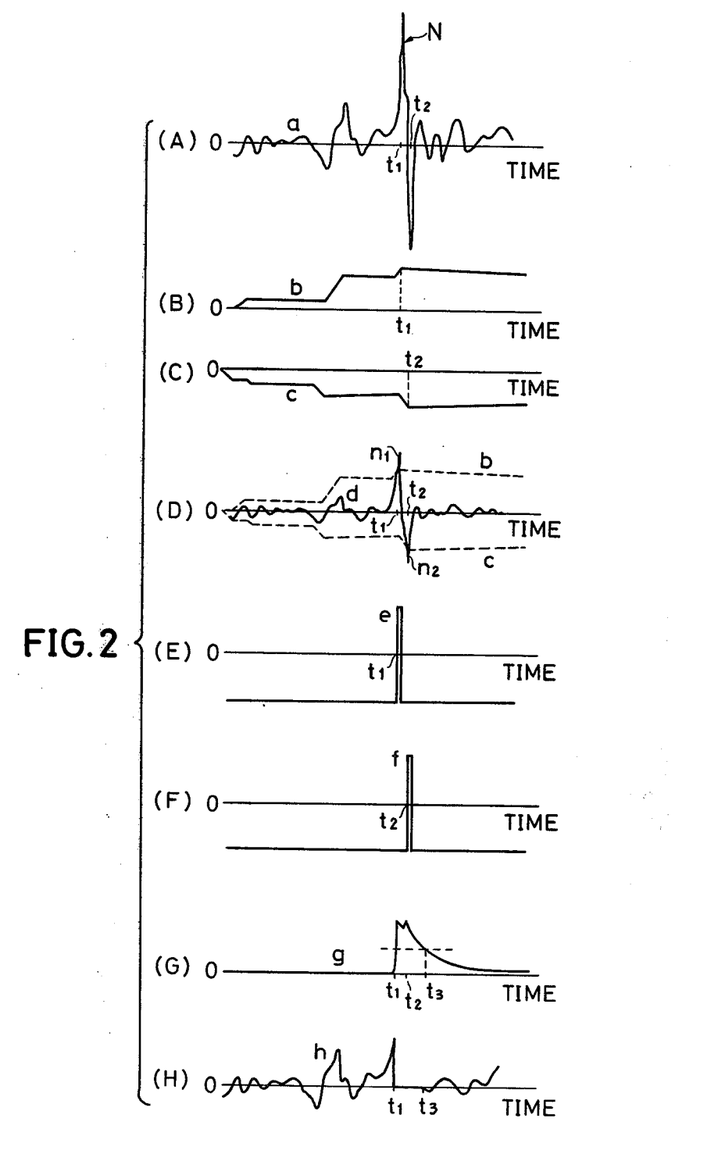
FIGS. 2(A) through 2(H) are graphs in the form of waveform time charts respectively indicating the waveforms of signals at various parts in the circuit illustrated in FIG. 1.

Accordingly, if the outut signal a of the amplifier 12 has a waveform wherein an impulsive noise N is admixed in an ordinary music signal as indicated in FIG. 2(A), for example, a signal b is produced with a waveform as indicated in FIG. 2(B). This signal is the output from the positive peak level detection circuit 14a. Here, the positive peak level detection circuit 14a has a time constant, as described above. The signal b is a signal of a waveform having, with respect to an ordinary music signal, a level which is higher than ½ of the wave height value. With respect to the impulsive noise N, the music signal level is in the order of a small fraction of the noise wave height value thereof. Simiarly, a signal c of a waveform indicated in FIG. 2(C) is obtained from the negative peak level detection circuit 14b. The output signals b and c are respectively supplied to an inversion input terminal of a voltage comparator 16a and to a non-inversion input terminal of a voltage comparator 16b.

The attenuation circuit 15a comprises resistors R4a and R5a. The attenuation circuit 15b comprises resistors R4b and R5b. The output signal a of the amplifier 12 is attenuated uniformly, for example, in the order of 8 dB, by the attenuation circuits 15a and 15b. The attenuated signals d having a waveform as indicated in FIG. 2(D) are respectively supplied from circuits 15a and 15b to the non-inversion input terminal and the inversion input terminal of the voltage comparators 16a and 16b, respectively.

The signals b and d are compared in the voltage comparator 16a. During the period wherein the level of the signal b is higher than the wave level of the signal d, the amplifier constituting the voltage comparator 16a becomes negatively saturated. A signal of constant negative level, as indicated in FIG. 2(E) is then produced as output. However, the level of the positive peak n1 of the impulsive noise exceeds the level of the signal b at the time instant when the impulsive noise N exists. Therefore, a detection signal e is produced as output from the voltage comparator 16a at the time instant t1, as indicated in FIG. 2(E). Similarly, signals c and d are compared by the voltage comparator 16b. A detection signal f, as indicated in FIG. 2(F), is produced by the voltage comparator 16b at a time t2 when the level of negative peak n2 of the attenuated impulsive noise exceeds the negative level of the signal c.

Here, the time constants and output levels of the peak level detection circuits 14a and 14b and the attenuation by the circuits 15a and 15b are selected as described above. The outputs of the attenuation circuits 15a and 15b exceed the outputs of the peak level detection circuits 14a and 14b only when there is an impulsive noise. Only the impulsive noise is positively detected. In an ordinary music signal, the peak level of a trumpet sound, for example, is higher than the average level. Since the repetitive cycles of the peak are in the order of 500 to 1,000 cycles per second as mentioned hereinbefore, and since the output levels of the peak level detection circuits also become high, there is no possibility of an erroneous detection. If the attenuation circuits 15a and 15b attenuate the input signal to $1/\alpha$, a satisfactory result can be obtained when the peak level detection circuits 14a and 14b generate output signals of levels which are higher than the $1/\alpha$ level of the input audio signal. A suitable value of $\alpha$ is 2 to 4.

The detection signals e and f are produced as outputs of the voltage comparators 16a and 16b. These signals are respectively supplied to a control voltage generating circuit 17 and, passing through diodes D2 and D3, charge a capacitor C3. A resistor R6 is connected in parallel with the capacitor C3. The capacitor C3 is charged by the input signals e and f and discharged when these signals are no longer received. This produces output signal g of a waveform as indicated in FIG. 2(G). This output signal g is supplied to the variable attenuation circuit 13 and is applied by way of a resistor R7 to the base of a transistor Q1. The transistor Q1 becomes conductive during the period between t1 and t3.

In general, the width of an impulsive noise is in the order of 100μ sec. At the most, less than ten noise impulses are generated at one time. Accordingly, the discharging time constant of the capacitor C3 and the resistor R6 is in the order of hundreds of μ sec. This R-C timing circuit is in the control voltage generating circuit 17 and is set in relation to the threshold level voltage of conductivity-nonconductivity of the transistor Q1. The period between the time instants t1 and t3 thus becomes a few hundred μsec. which corresponds to the generation period of the impulsive noise. The time t3 is the instant at which the voltage of the signal g becomes less than the threshold level voltage of the transistor Q1. The charging time constant determined by the forward direction resistance of the diodes D2 and D3 and the capacitance of the capacitor C3 is very small.

The variable attenuation circuit 13 comprises the resistor R7, a resistor R8, the transistor Q1, and a capacitor C4. When the transistor Q1 is conductive, one terminal of the resistor R8 is grounded for AC. Consequently, the signal a, supplied from the amplifier 12 to the variable attenuation circuit 13, is AC grounded between the times t1 and t3. A signal h is muted to zero during the period t1 to t3. The impulsive noise N has been removed, as indicated in FIG. 2(H). The resulting signal is led out through an output terminal 19 to the system.

In the case of this output signal h, there is no signal in the interval t1 to t3. A signal level attenuation period is in the order of a number of hundreds of μsec. and is almost undetectable to the human ear. No deterioration of the quality of the reproduced music signal can be discerned by those having normal hearing. Thus, impulsive noise, which is readily heard by ear, is effectively removed, to prevent any lowering of tone quality, due to impulsive noise.

The above described circuit arrangement may be modified to some extent. For example, one of the attenuation circuits 15a and 15b, say the attenuation circuit 15b, may be omitted. The output signal of the attenuation circuit 15a is supplied to the non-inversion input terminal of the voltage comparator 16a and the inversion input terminal of the voltage comparator 16b may be used. Furthermore, instead of providing the attenuation circuits 15a and 15b, an amplification circuit of 6 dB, for example, may be provided in the stage in front of the peak level detection circuits 14a and 14b. That is, the essential requirement for the circuit organization is that, when no impulsive noise exists, the output signal level of the peak level detection circuits 14a and 14b should be relatively higher than the level of the reproduced audio signal to be compared therewith. When an impulsive noise exists, the peak level of the impulsive noise to be compared with the output signal level of the peak level detection circuits 14a and 14b should be higher than this output signal level.

In the above described embodiment of the invention, the output of each peak level detection circuit and the output of an attenuation circuit are compared and the relationship of their magnitudes is examined. Alternatively, the positive or negative value resulting from a subtraction of these two outputs may be examined, thereby to determine the relationship of their magnitudes. Embodiments of the invention adapted to operate in this alternative manner are described below.

Figures 3, 4:
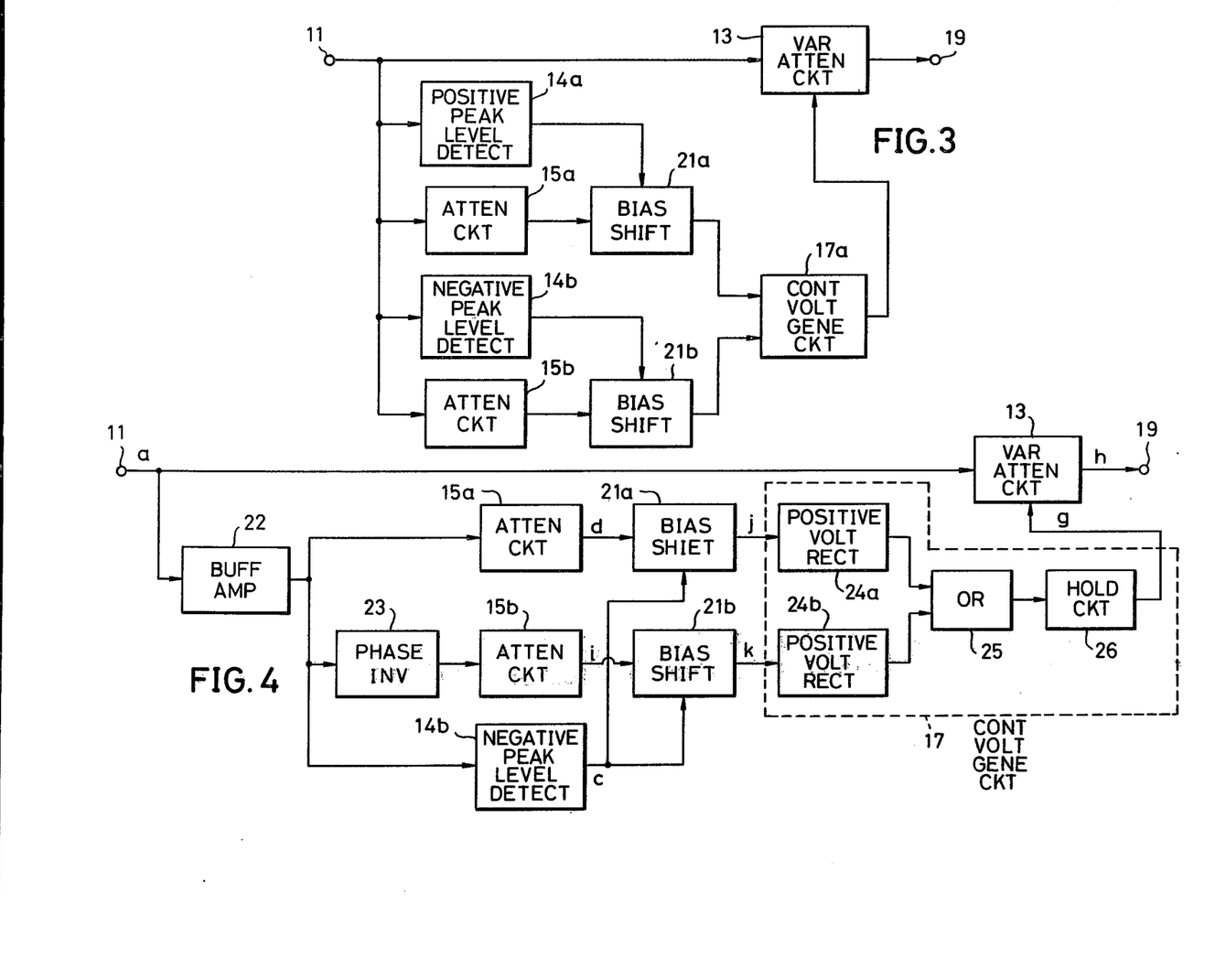
FIG. 3 is a block diagram showing the general organization of a second embodiment of the invention.
FIG. 4 is a block diagram showing a third embodiment of the invention.

A second embodiment of the invention will be described with reference to FIG. 3. In FIG. 3, those parts which are the same as corresponding parts in FIG. 1 are designated by like reference numerals. A detailed description of such parts will be omitted. The output of the attenuation circuit 15a is fed to a bias shift circuit 21a comprising an addition circuit. There its center level (zero) line position is shifted responsive to a signal from the positive peak level detection circuit 14a. A similar operation is carried out in a bias shift circuit 21b which is supplied with the output signals of the attenuation circuit 15b and the negative peak level detection circuit 14b. The output signals of the bias shift circuits 21a and 21b are supplied to a control voltage generating circuit 17a including diodes connected in the forward and reverse directions.

The output signals of the bias shift circuits 21a and 21b do not exceed the center level line in the case of an ordinary music signal. However, the output signal exceeds the center level line when an impulsive noise is present. The control voltage generating circuit 17a generates a control voltage in response to that part of the signal exceeding the center level line and causes an attenuation of the signal fed to the variable attenuation circuit 13. This is similar to the preceding embodiment of the invention. The impulsive noise is thus removed.

In the above described embodiment of the invention, one of the peak level detection circuits 14a and 14b may be omitted. One example of such a circuit is illustrated by a third embodiment of the invention, as described below in conjunction with FIG. 4. In FIG. 4, those parts which are the same as corresponding parts in FIGS. 1 and 3 are designated by like reference numerals. A detailed description of such parts will be omitted.

A reproduced audio signal is introduced into the system through an input terminal 11 and supplied to the variable attenuation circuit 13. At the same time, it is supplied by way of a buffer amplification circuit 22 to the attenuation circuit 15a, a phase inversion circuit 23, and the negative peak level detection circuit 14b. The waveform of the output signal of the negative peak level detection circuit 14b is similar to that indicated in FIG. 2(C). This output signal is fed to the bias shift circuits 21a and 21b comprising addition circuits. There it is added with the signals from the attenuation circuits 15a and 15b, and the center level (zero) line thereof is shifted.

Figure 6:
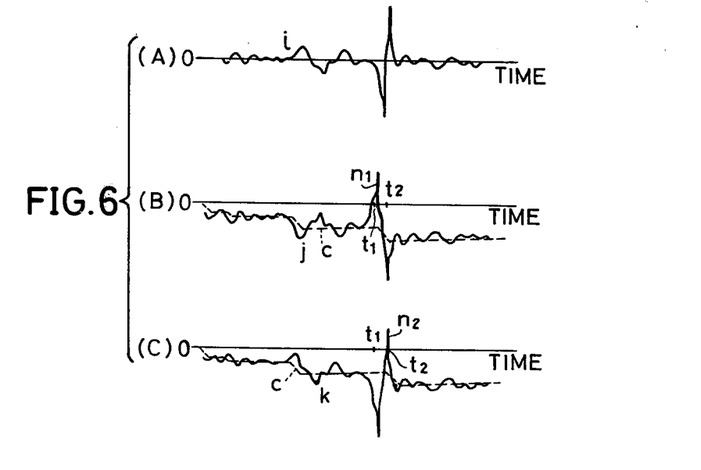
FIGS. 6(A), 6(B), and 6(C) are graphs in the form of waveform time charts respectively for a description of the operation of the circuit shown in FIG. 5.

The waveform of the output signal of the attenuation circuit 15a is similar to that indicated in FIG. 2(D). Furthermore, the signal which has passed through the phase inversion circuit 23 and the attenuation circuit 15b becomes a signal of an inverted and attenuated waveform as indicated in FIG. 6(A). Consequently, the output signals which have been shifted in the bias shift circuits 21a and 21b responsive to the output signal of the negative peak level detection circuit 14b respectively become signals j and k of the waveforms respectively indicated in FIGS. 6(B) and 6(C).

These signals j and k are supplied to the control voltage generating circuit 17. There those positive parts exceeding the center level line at the time instants t1 and t2 are respectively extracted by positive voltage rectification circuits 24a and 24b. The signals thus extracted are passed through an OR circuit 25 and supplied to a holding circuit 26 to be held for a period in the order of a number of hundreds of $\mu$sec. The output control signal of the holding circuit 26 controls the variable attenuation circuit 13 and removes impulsive noise, which is similar to the preceding embodiments of the invention.

Figure 5:
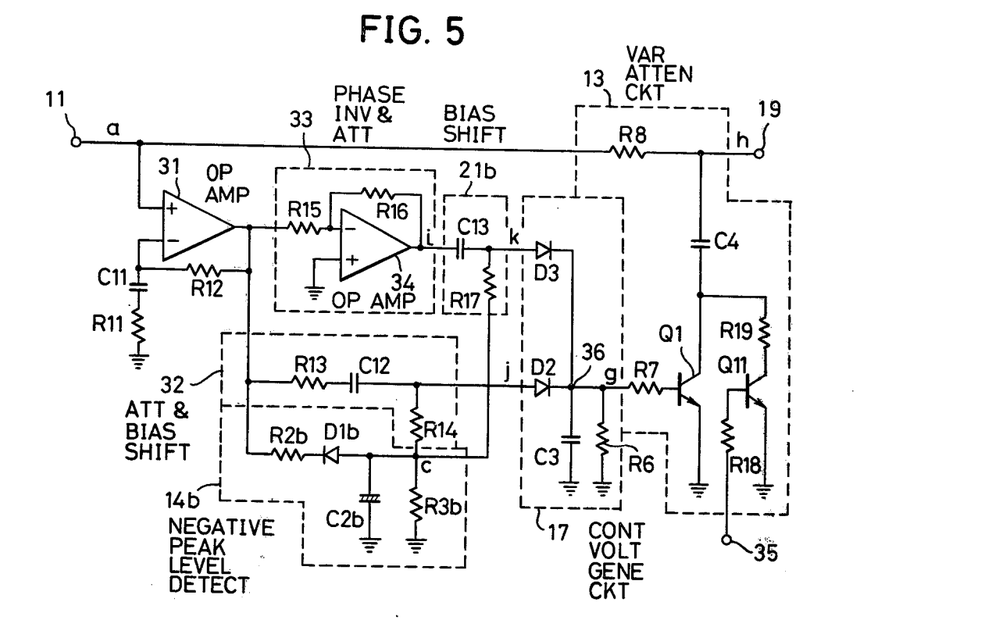
FIG. 5 is an electrical circuit diagram of the third embodiment of the invention illustrated in FIG. 4.

One example of a specific electrical circuit for the embodiment of FIG. 4 will now be described with reference to FIG. 5. A reproduced audio signal is introduced through the input terminal 11 and supplied to the variable attenuation circuit 13. At the same time, it is supplied to an operational amplifier 31. The operational amplifier 31, resistors R11 and R12, and a capacitor C11 constitute a non-inversion amplifier, whose gain is determined by the gain of the amplifier itself and the characteristics of a negative feedback circuit. In the present embodiment of the invention, the gain in the high-frequency range is determined by the resistance values of the resistors R11 and R12. The gain in the middle-frequency and low-frequency ranges are reduced by the capacitor C11. The reasons for this are that the high-frequency component of the frequency component of an impulsive noise is large and that the delay period of the noise removing operation is shortened by advancing the phase of the signal.

The output signal of the amplifier 31 is supplied to an attenuation and bias shift circuit 32, a phase inversion and attenuation circuit 33, and the negative peak level detection circuit 14b. The negative peak level detection circuit 14b has the same circuit that is shown in the corresponding circuit in FIG. 1. The attenuation and bias shift circuit 32 correspond to the attenuation circuit 15a and bias shift circuit 21a and comprises resistors R13 and R14 and a capacitor C12. The resistors R13 and R14 constitute an attenuation circuit, while the capacitor C12 and the resistor R14 constitute a bias shift circuit. A signal j, as indicated in FIG. 6(B), is produced as an output by this attenuation and bias shift circuit 32.

The phase inversion and attenuation circuit 33 correspond to the phase inversion circuit 23 and the attenuation circuit 15b. The signal supplied to this phase inversion and attenuation circuit 33 is applied through a resistor R15 to the inversion input terminal of an operational amplifier 34. The output side of this operational amplifier 34 is connected by way of a resistor R16 to its inversion input terminal. Its non-inversion input terminal is grounded. The amplifier 34 is a phase inversion amplifier of −6 dB, for example, because of the resistance of the resistors R15 and R16 wherein the ratio R16/R15 is approximately equal to one-half. The signal supplied to the phase inversion and attenuation circuit 33 is here phase inverted and, at the same time, attenuated, whereupon an output signal i is produced, as indicated in FIG. 6(A).

This signal i is shifted by the signal c from the negative peak level detection circuit 14b in the bias shift circuit 21b comprising a capacitor C13 and resistors R17 and is formed into the signal k as indicated in FIG. 6(C).

The signals j and k through the diodes D2 and D3 of the control voltage generating circuit 17 corresponding to the aforedescribed positive voltage rectification circuits 24a and 24b. Positive parts n1 and n2, corresponding to the impulsive noise, are extracted the signal passes through a point 36 corresponding to the OR circuit 25, charges the capacitor C3 corresponding to the aforementioned holding circuit 26. When a voltage which is higher than the forward direction voltage of the diodes D2 and D3 (e.g., 0.6V in the case of silicon diodes) is applied to their anodes, a voltage resulting from the subtraction of the forward direction voltage from the higher voltage is accumulated in the capacitor C3. The discharge time constant of the capacitor C3 and the resistor R6 is a value similar to that in the first embodiment of the invention. The signal g of the waveform indicated in FIG. 2(G) is produced as output.

This signal g is applied to the base of the transistor Q1 of the variable attenuation circuit 13. Then, as in the first embodiment of the invention, the impulsive noise has been removed from the output signal h which is led out through the output terminal 19.

In the variable attenuation circuit 13 of this system, there is a transistor Q11 whose collector is connected through a resistor R19 to the collector of the transistor Q1. A positive DC voltage is applied from a terminal 35 through a resistor R18 to the base of this transistor Q11, which is thereby switched into its conductive state. The circuit made up of these circuit elements eliminate fluctuations of the collector potential of the transistor Q1 due to the ON-OFF controlling of the transistor Q1. This continually maintains the collector potential at a constant value (e.g., of the order of 10 mV).

Figure 7:
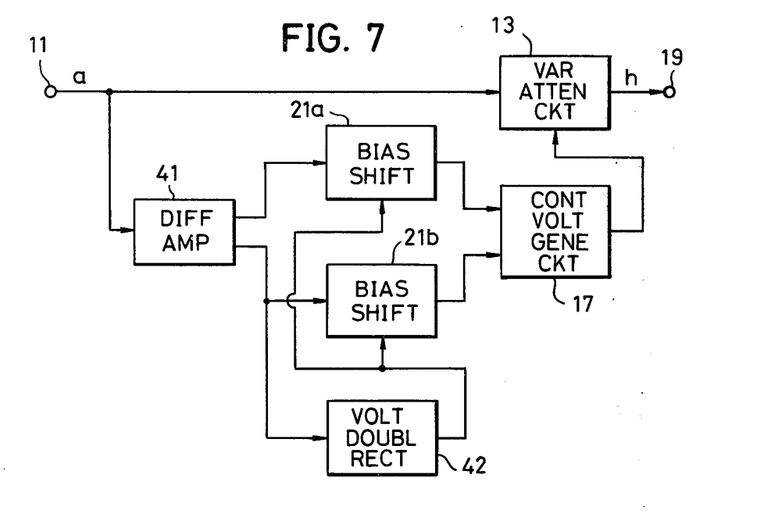
FIG. 7 is a block diagram showing the general organization of a fourth embodiment of the invention.

A fourth embodiment of the invention will now be described in conjunction with FIG. 7. In FIG. 7, those parts which are the same as corresponding parts in FIGS. 1, 3, and 4 are designated by like reference numerals. A detailed description of such parts will not be repeated.

A reproduced audio signal a is introduced into the system through the input terminal 11 and is supplied to the variable attenuation circuit 13. At the same time, it is applied to a differential amplifier 41. This differential amplifier 41 produces a positive output which is supplied to the bias shift circuit 21a and a negative output which is supplied to the bias shift circuit 21b and to a negative voltage doubler rectification circuit 42. This negative voltage doubler rectification circuit 42 generates a double voltage in response to the negative peak level of the output of the differential amplifier 41. The time constants of the rise and fall of the output of this negative voltage doubler rectification circuit 42 are similar to those in the preceding embodiments of the invention. The output of this negative voltage doubler rectification circuit 42 is supplied to the bias shift circuits 21a and 21b and shifts the output signals of the differential amplifier 41.

In the present embodiment of the invention, a negative voltage doubler rectification circuit 42 is used as a negative peak level detection circuit. A double voltage is produced an output. There is no need for attenuating the output of the differential amplifier 41 supplied to the bias shift circuits 21a and 21b. Accordingly, attenuation circuits 15a and 15b, such as those used in the preceding embodiments of the invention, are not used.

Figure 8:
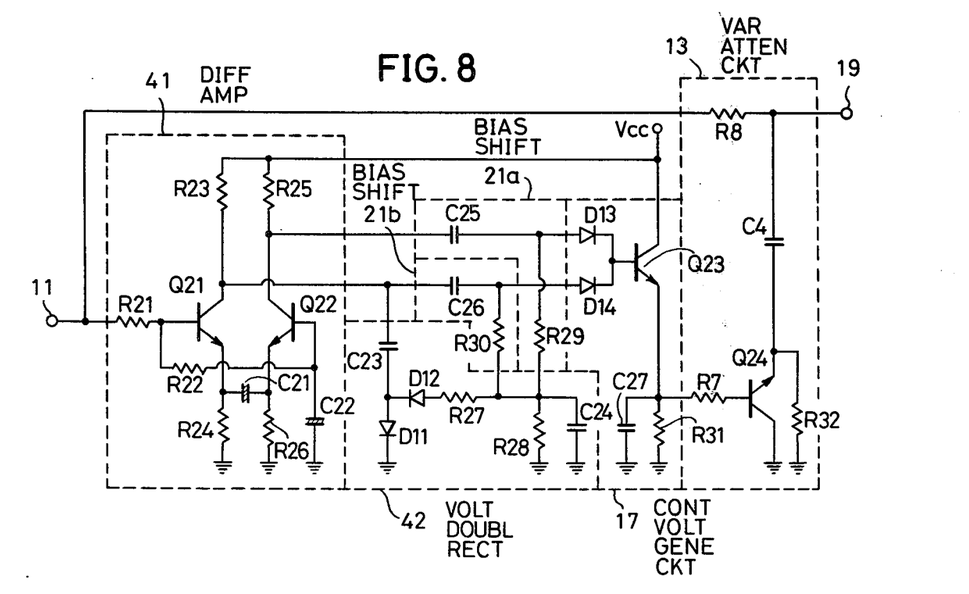
FIG. 8 is an electrical circuit diagram of the fourth embodiment of the invention shown in FIG. 7.

One example of a specific electrical circuit diagram for the system illustrated in FIG. 7 will now be described with reference to FIG. 8. The differential amplifier 41 comprises resistors R21 through R26, capacitors C21 and C22, and transistors Q21 and Q22 connected as shown. A positive output signal from the collector of the transistor Q22 is supplied to the bias shift circuit 21a comprising a resistor R29 and a capacitor C25. A negative output signal from the collector of the transistor Q21 is supplied to the bias shift circuit 21b comprising a resistor R30 and a capacitor C26, and to the negative voltage doubler rectification circuit 42 comprising resistors R27 and R28, capacitors C23 and C24, and diodes D11 and D12.

The negative voltage doubler rectification circuit 42, with a specific rise time constant, detects negative peak levels and generates a negative double voltage. The output of this negative voltage doubler rectification circuit 42 is supplied to the bias shift circuits 21a and 21b. This bias shifts the reference level line of the signal from the differential amplifier 41. As a result, all of the ordinarily reproduced audio signals are below the zero level, and only the peak of an impulsive noise becomes a signal exceeding the zero level.

It is also possible to omit the capacitor C24 of the negative voltage doubler rectification circuit 42 and to cause the capacitors C25 and C26 of the bias shift circuits 21a and 21b to assume the function thereof. In this case, it is possible to omit the resistor R27 and to assign their function to the resistors R29 and R30.

The control voltage generating circuit 17 comprises forwardly connected diodes D13 and D14, a transistor Q23, a resistor R31, and a capacitor C27. When a positive voltage corresponding to the peak of an impulsive noise and exceeding a specific voltage is applied by way of the diodes D13 and D14 to the base of the transistor Q23, the transistor becomes conductive. The voltage from a power source Vcc is charged into the capacitor C27. The discharge time constant is determined by the capacitor C27 and the resistor R31.

The variable attenuation circuit 13 in this system comprises the resistors R7 and R8, a resistor R32, the capacitor C4, and a collector grounded transistor Q24. In the circuit of FIG. 5, the transistor Q1 is of emitter grounded type. A circuit comprising the transistor Q11 and the resistors R18 and R19 is used to prevent a fluctuation of the collector voltage. However, when a collector grounded transistor such as transistor Q24 is used, the voltage between the emitter and ground experiences only a slight variation in the order of 1mV, as a result of the ON-OFF operation of the transistor. Accordingly, the ON-OFF operation of the transistor Q24 produces almost no noise even when a bias voltage is not imparted beforehand to the emitter of the transistor Q24. Therefore, in the circuit of the instant embodiment of the invention, the only connection rquired is the resistor R32 between the emitter of the transistor Q24 and ground. Other features of the circuit of this system are similar to those of the preceding embodiments of the invention and, therefore, will not be described again.

Further, this invention is not limited to these embodiments. Variations and modifications may be made without departing from the scope and spirit of the invention.

What is claimed is:

1. An impulsive noise reducing system comprising:
   peak level detection means for producing a detection signal with a specific rise time and a specific fall time in response to positive and/or negative peak levels of an input signal, said fall time being in the range of 50 to 5000 times greater than said rise time;
   means for generating a control signal when the positive and/or negative peak levels of impulsive noise admixed in said input signal exceed the level of said detection signal; and
   means operating in response to said control signal to suppress that part of said input signal which contains said impulsive noise.

2. An impulsive noise reducing system comprising:
   peak level detection means for producing a detection signal with a specific rise time and a specific fall time in response to positive and/or negative peak levels of an input signal, said fall time being in the range of 50 to 5000 times greater than said rise time;
   means for attenuating said input signal by a specific quantity;
   means for comparing the resulting output detection signal voltage of said peak level detection means and the resulting output attenuated signal voltage of said attenuating means, said comparing means detecting when said attenuated signal voltage exceeds said detection voltage, and for generating a control signal corresponding to that part of said attenuated signal voltage in which impulsive noise admixed in said attenuated signal exceeds said detection signal voltage; and means responsive to said control signal for suppressing that part of said input signal wherein said impulsive noise exists.

3. An impulsive noise reducing system as claimed in claim 2 in which said peak level detection means comprises a first peak level detection circuit means for producing a first detection signal with a specific rise time and a specific fall time in response to a positive peak level of said input signal and a second peak level detection circuit means for producing a second detection signal with a specific rise time and a specific fall time in the negative direction in response to a negative peak level of the input signal; and said control signal generating means comprises a first voltage comparator means for producing an output responsive to a comparison of the voltage of said first detection signal and the output signal voltage of said attenuation means, a second voltage comparator means for producing an output responsive to a comparison of the voltage of said second detection signal and the output signal voltage of said attenuation means, and a control signal generating circuit means for generating a control signal when said outputs of said first and second voltage comparator means exceed a predetermined voltage.

4. An impulsive noise reducing system as claimed in claim 3 in which said first voltage comparator means comprises a first operational amplifier means having an inversion input terminal to which said first detection signal is applied and a non-inversion input terminal to which said attenuated signal is applied; and said second voltage comparator means comprises a second operational amplifier means having a non-inversion input terminal to which said second detection signal is applied and an inversion input terminal to which said attenuated signal is applied.

5. An impulsive noise reducing system comprising:
peak level detection means for producing a detection signal with a specific rise time and a specific fall time in response to positive and/or negative peak levels of an input signal, said fall time being in the range of 50 to 5000 times greater than said rise time;
means for attenuating said input signal by a specific quantity;
means for shifting the center level of the resulting output attenuated signal of said attenuating means in response to said detection signal, means for generating a control signal responsive to any attenuated signals which exceed a predetermined level when a part of said attenuated signal which corresponds to impulsive noise is admixed in said input signal and exceeds said predetermined level; and means responsive to said control signal for suppressing the part of said input signal which contains said impulsive noise.

6. An impulsive noise reducing system as claimed in claim 5 in which:
said peak level detection means comprises a peak level detection circuit means for producing a detection signal voltage with a specific rise time and a specific fall time in the negative direction in response to a negative peak level of said input signal, said fall time being in the range of 50 to 5000 times greater than said rise time;
said attenuating means comprises a first attenuation circuit means for directly attenuating said input signal and a second attenuation circuit means for phase inverting and then attenuating the input signal; and
said control signal generating means comprises a first shift circuit means for shifting the center level of the attenuated output signal of said first attenuation circuit means in response to said control signal, a second shift circuit means for shifting the center level of the phase inverted output signal of said second attenuation circuit means in response to said control signal, and a control signal generating circuit means for generating said control signal when the levels of the output signals of the first and second shift circuit means exceed a reference level.

7. An impulsive noise reducing system comprising:
peak level detection means for producing a detection signal of a doubled voltage with a specific rise time and a specific fall time in response to positive and/or negative peak levels of an input signal, said fall time being in the range of 50 to 5000 times greater than said rise time;
means for shifting the center level of said input signal in response to said detection signal, means for detecting when the level of the shifted input signal exceeds a predetermined level and for generating a control signal responsive to impulsive noise admixed in the input signal exceeding said predetermined level; and
means responsive to said control signal for suppressing the input signal when said impulsive noise exists.

8. An impulsive noise reducing system as claimed in claim 7 which further comprises a differential amplifier means for supplying said input signal, and in which: said peak level detection means comprises a voltage doubler rectification circuit means supplied with a negative output of said differential amplifier for producing said detection signal; and said control signal generating means comprises a first shifting circuit means for shifting the center level of a positive output of said differential amplifier means in response to said detection signal, a second shifting circuit means for shifting the center level of a negative output of the differential amplifier means in response to said detection signal, and a control signal generating circuit means for generating said control signal when the level of each of the output signals of the first and second shifting circuit means exceeds a reference level.

* * * * *